United States Patent
Loerzer et al.

[11] Patent Number: 5,925,490
[45] Date of Patent: Jul. 20, 1999

[54] MULTILAYER RECORDING ELEMENT SUITABLE FOR PRODUCING FLEXOGRAPHIC PRINTING PLATES BY DIGITAL INFORMATION TRANSFER

[75] Inventors: Thomas Loerzer, Landau; Cliff Scherer; Oskar Nuyken, both of München, all of Germany

[73] Assignee: BASF Lacke & Farben Aktiengesellschaft, Muenster, Germany

[21] Appl. No.: 08/820,286

[22] Filed: Mar. 18, 1997

[51] Int. Cl.$^6$ .............................. G03C 1/52; G03F 7/095
[52] U.S. Cl. ................ 430/156; 430/273.1; 430/306
[58] Field of Search ............................. 430/156, 273.1, 430/306

[56] References Cited

U.S. PATENT DOCUMENTS

| | | | |
|---|---|---|---|
| 4,292,152 | 9/1981 | Lechtken et al. | 204/159 |
| 4,555,471 | 11/1985 | Barzynski et al. | 430/273.1 |
| 5,262,275 | 11/1993 | Fan | 430/273.1 |

FOREIGN PATENT DOCUMENTS

| | | | |
|---|---|---|---|
| 001138 | 3/1979 | European Pat. Off. | G03F 7/02 |
| 369398 | 5/1990 | European Pat. Off. | G08G 79/02 |
| 634695 | 1/1995 | European Pat. Off. | G03F 1/00 |
| 41 17 127 | 5/1991 | Germany | G03F 7/09 |
| 19536805 | 10/1995 | Germany | G03F 7/095 |
| 94/03839 | 2/1994 | WIPO | G03F 7/095 |

OTHER PUBLICATIONS

Zavalishina et al., Zhurnal Obshchei Khimii, vol. 38, No. 10, pp. 2271–2276, Oct. 1968 (translation thereof).
Penczek et al., Macromolecules, vol. 26, pp. 2228–2233, 1993.
Pretula et al., Makromol. Chem., vol. 191, pp. 671–680, 1990.
*Patent Abstracts of Japan*, vol. 7, No. 138 (P–204), Jun. 10, 1983 (English abstract of JP 58 052646, Mar. 28, 1983).

*Primary Examiner*—Bernard Codd
*Attorney, Agent, or Firm*—Keil & Weinkauf

[57] ABSTRACT

In a multilayer recording element which is suitable for producing flexographic printing plates by digital information transfer and has, arranged one on top of the other on a dimensionally stable substrate, a layer (A) which is crosslinkable by actinic radiation, a layer (B) sensitive to actinic radiation and, if required, a peelable cover sheet, the layer (A) crosslinkable by actinic radiation is crosslinked by imagewise exposure to actinic radiation of from 0.5 to 5 J/cm$^2$ and can then be washed out by a developer and essentially comprises a mixture of at least one elastomeric binder, ethylenically unsaturated copolymerizable organic compounds, photoinitiator, and, if required, further assistants, and the layer (B) sensitive to actinic radiation is a layer which is soluble or dispersible in developers and has an optical density of >2.5 in the actinic range, undergoes a change the optical density by >1 as a result of one or more laser pulses in the wavelength range from 254 to 532 nm with an energy of from >5 to 50 J/cm$^2$ and essentially comprises arylazophosphonate-containing compounds.

5 Claims, No Drawings

MULTILAYER RECORDING ELEMENT SUITABLE FOR PRODUCING FLEXOGRAPHIC PRINTING PLATES BY DIGITAL INFORMATION TRANSFER

The present invention relates to a multilayer recording element which is suitable for producing flexographic printing plates by digital information transfer and has, arranged one on top of the other on a dimensionally stable substrate, a layer which is crosslinkable by actinic radiation and, if required, is bonded to the dimensionally stable substrate by an adhesion-promoting layer, a layer ablatable by actinic laser radiation and, if required, a peelable cover sheet.

Flexographic printing plates consist of a photosensitive photopolymerizable layer which is applied to a dimensionally stable substrate, for example a polyethylene terephthalate film or an aluminum sheet. An adhesion-promoting layer can furthermore be applied between these layers in order to provide adhesion for the composite. Furthermore a release layer may be present on the photosensitive, photopolymerizable layer. This release layer is required whenever the photosensitive, photopolymerizable layer underneath is so tacky that, when the photographic negative is placed on top, the air present cannot be uniformly removed in the vacuum exposure frame, and would lead to vacuum defects during exposure.

The information contained in the photographic negative is transferred to these photosensitive, photopolymerizable layers by placing a photographic negative on top, removing the air by means of a vacuum frame and carrying out uniform exposure. In the subsequent development step, the nonphotopolymerized parts are removed by suitable developers, the photopolymerized image sections are insoluble and thus form the relief structure. The developer must be tailored to the photopolymerizable layer used and, if required, also to the release layer used. Depending on the type of binder, suitable developers are in general mixtures of perchloroethylene with alcohols, mixtures of hydrocarbons with alcohols, mixtures of alcohol and water, pure water or mixtures of water and components soluble therein, such as sodium carbonate, sodium hydroxide, citric acid, lactic acid, surfactants, etc. The development step is followed by a drying step in order to remove the developer from the partially swollen relief layer. Depending on the photosensitive material, the plate may require further processing steps. Thus, in the case of some printing plates, uniform post exposure is also necessary in order to cure the printing plate completely. For example, in the case of printing plates based on styrene-butadiene [isoprene] block copolymers, the surfaces may furthermore be rendered nontacky by UVC aftertreatment.

In the process described here, the information is transferred via a photographic negative. According to the prior art, photographic negatives can be produced by exposing a photosensitive film by means of a plotter with subsequent development. The information transferred to the film originates nowadays from a digitized data set. It would therefore be desirable to be able to produce a flexographic printing plate without the circuitous route via a photographic negative. In addition to shorter production times, the costs for the production of a photographic negative would not be incurred. Moreover, the wet chemical processes in film development would no longer be required. In addition, the geometric dimensions of a photographic negative can change as a result of temperature and atmospheric humidity, which can lead to register problems of the finished flexographic printing plate since the information of the photographic negative is transferred as a 1:1 projection on exposure of a corresponding photosensitive photopolymerizable layer.

Digital processes in which no photographic negative is required have also long been known.

Thus, U.S. Pat. No. 4,555,471 describes a mask film which can be applied directly to a photopolymerizable plate. The optical density of the mask film, which has a thermochromic system, can be influenced by laser exposure, and the negative can be produced in this manner.

Furthermore, EP 0001138-A 1 describes a process for the production of lithographic printing plates with formation of a "fugitive negative".

DE 4117127 A 1 describes a process in which an image mask is produced on photosensitive recording elements by using an inkjet printer or electrophotographic printer. The disadvantage here is that the resolution is not sufficiently fine for high-quality flexographic halftone printing.

WO 94/03839 describes a process in which a photosensitive recording element is structured by means of an IR laser and an image mask is produced in this manner. Here, the photosensitive recording element consists of a substrate, a photosensitive layer, a layer which is sensitive to IR light and opaque to actinic light and a film. During exposure to the IR laser, the exposed parts of the layer sensitive to IR light are fixed on the film present on top and can be removed together with the film by peeling off the latter. An image mask on the photosensitive recording layer is thus obtained. The disadvantage here is that the film, which is also intended to provide mechanical protection, may become damaged, for example scratched, leading to defective information transfer.

U.S. Pat. No. 5,262,275 describes a process in which flexographic printing plates are provided with digital images also by means of an IR laser. The recording element consists of a substrate, a photosensitive layer, a barrier layer and a layer which is sensitive to IR light and opaque to actinic light. The layer sensitive to IR light is recorded on directly by means of the IR laser, the material sensitive to IR light being evaporated from the parts recorded on and the layer thus becoming transparent to actinic light in these parts. The barrier layer still present remains on the surface of the photopolymerizable layer.

This barrier layer is intended to prevent atmospheric oxygen from penetrating into the photopolymerizable layer during the photo-polymerization and thus increasing the exposure time. Furthermore, the results of the exposure step should be better reproducible in comparison with a recording element in which this barrier layer is absent.

DE-19536805-A likewise describes a process for the production of flexographic printing plates, in which the barrier layer can be dispensed with and the printing plate obtained surprisingly gives very much better printed copies.

It is an object of the present invention to provide a multilayer recording element which is suitable for producing flexographic printing plates by digital information transfer and in which, instead of the expensive IR laser, an economical UV laser is used to produce a mask.

We have found that this object is achieved, surprisingly, by the layer structure according to the invention.

The present invention relates to multilayer recording elements which are suitable for producing flexographic printing plates by digital information transfer and have, arranged one on top of the other on a dimensionally stable substrate, a layer (A), which is crosslinkable by actinic radiation and, if required, is bonded to the dimensionally stable substrate by an adhesion-promoting layer, a layer (B) which is likewise sensitive to actinic radiation and, if required, a peelable cover sheet, wherein the layer (A) crosslinkable by actinic radiation is crosslinked by imagewise exposure to actinic radiation of from 0.5 to 5 J/cm$^2$ and can then be washed out by a developer and essentially comprises a mixture of at least one elastomeric binder, ethylenically unsaturated copolymerizable organic compounds, a photoinitiator or photoinitiator system and, if required, further assistants, and the layer (B), which is also sensitive to actinic radiation, is a layer which is soluble or dispersible in the developer, has an optical density of >2.5 in the actinic range, undergoes a change in the optical density by >1 as a result of one or more laser pulses in the wavelength range from 254 to 532 nm with an energy of from >5 to 50 J/cm$^2$ and essentially comprises arylazophosphonate-containing compounds.

The advantageous possibilities for the design of the novel recording elements include the fact that water or alcohol/water mixtures are suitable as developers both for the layer (A) and for the layer (B) and that an organic solvent or solvent mixture is suitable both for layer (A) and for layer (B), or an organic solvent or solvent mixture is suitable as a developer for layer (A) and water or an alcohol/water mixture is suitable as a developer for layer (B).

The present invention also relates to a process for producing flexographic printing plates, wherein the layer (B) of the multilayer recording element, which layer is sensitive to actinic radiation, is structured imagewise from a digital data set by means of a UV laser and a mask is thus produced on the layer (A) underneath, the layer (A) is then crosslinked by uniform exposure to actinic radiation in the subsequently printing parts and the layer (B) is then dispersed or dissolved in a developer and the noncrosslinked image sections of the layer (A) are developed in the same or a different developer.

The novel recording element is very suitable for digital information transfer.

Suitable dimensionally stable substrates are those conventionally used for flexographic printing plate production.

Examples of suitable dimensionally stable substrates are sheets, films and conical and cylindrical sleeves of metals such as steel, aluminum, copper or nickel or of plastics such as polyethylene terephthalate, polybutylene terephthalate, polyamide and polycarbonate, woven fabrics and nonwovens, such as glass fiber fabrics and composite materials comprising glass fibers and plastics.

Particularly suitable dimensionally stable substrates are dimensionally stable substrate films, for example polyethylene or polyester films, in particular polyethylene terephthalate films. These substrate films are generally from 50 to 500 μm, preferably 75 to 400 μm, for example about 125 μm, thick.

These substrate films may be coated with a thin adhesion-promoting layer, for example a 1 to 5 μm thick layer, on that side of the substrate film which faces the photosensitive recording layer. This adhesion-promoting layer may consist of, for example, a mixture of a polycarbonate, a phenoxy resin and a polyfunctional isocyanate.

The layer (A) crosslinkable by actinic radiation is, according to the invention, a layer which essentially comprises a mixture of at least one elastomeric binder, one or more ethylenically unsaturated copolymerizable organic compounds, a photoinitiator or a photoinitiator system and, if required, further assistants and can be washed out by a developer after imagewise exposure.

Examples of suitable elastomeric binders are elastomeric polymeric binders, for example polyalkanedienes, vinylaromatic/alkadiene copolymers and block polymers, alkadiene/acrylonitrile copolymers, ethylene/propylene copolymers, ethylene/propylene/alkadiene copolymers, ethylene/acrylic acid copolymers, alkadiene/acrylic acid copolymers, alkadiene/acrylate/acrylic acid copolymers and ethylene/(meth)acrylic acid/(meth)acrylate copolymers.

Very particularly suitable elastomers are those which contain conjugated alkadienes such as butadiene or isoprene, and styrene as polymerized units.

The elastomeric binder is contained in the photopolymerizable layer (A) in an amount of from 50 to 95, preferably from 50 to 90%, by weight, based on the total amount of the components in (A).

Furthermore, the photopolymerizable relief-forming recording layer (A) to be used according to the invention contains conventional and known copolymerizable ethylenically unsaturated organic compounds which are compatible with the polymeric binders, in an amount of from 1 to 60, advantageously from 2 to 50, and in particular from 3 to 40%, by weight, based on the total amount of (A). The term "compatible" indicates that the relevant monomers are readily miscible with the elastomeric binder so that no haze or striation is caused in the relevant photopolymerizable relief-forming recording layer (A). Examples of suitable monomers are the conventional and known acrylates and methacrylates of monohydric or polyhydric alcohols, acrylamides and methacrylamides, vinyl ethers, and vinyl esters, allyl ethers and allyl esters, and fumaric and maleic diesters, in particular the esters of acrylic and/or methacrylic acid with monohydric and, preferably, polyhydric alcohols, for example esters of acrylic or methacrylic acid with ethanediol, propanediol, butanediol, hexanediol or oxaalkanediols, e.g. diethylene glycol, or esters of acrylic or methacrylic acid with trihydric or polyhydric alcohols, e.g. glycerol, trimethylolpropane, pentaerythritol or sorbitol. Examples of particularly suitable monofunctional and polyfunctional acrylates and methacrylates are butyl acrylate, butyl methacrylate, 2-ethylhexyl acrylate, lauryl (meth)acrylate, hexanediol diacrylate, hexanediol dimethacrylate, ethylene glycol di(meth)acrylate, butanediol 1,4-di(meth)acrylate, neopentyl glycol di(meth)acrylate, 3-methylpentanediol di(meth)acrylate, 2-hydroxypropyl (meth)acrylate, 2-hydroxyethyl (meth)acrylate, 1,1,1-trimethylolpropane tri(meth)acrylate, di-, tri- and tetraethylene glycol di(meth)acrylate, tripropylene glycol di(meth)acrylate or pentaerythrityl tetra(meth)acrylate and furthermore poly(ethylene oxide) di(meth)acrylate, ω-methylpoly(ethylene oxide)-α-yl (meth)acrylate, N,N-diethylaminoethyl acrylate, a reaction product of 1 mol of glycerol, 1 mol of epichlorohydrin and 3 mol of acrylic acid and glycidyl methacrylate and bisphenol A diglycidyl ether acrylate.

Mixtures of photopolymerizable ethylenically unsaturated organic compounds and, for example, mixtures of monofunctional (meth)acrylates, e.g. hydroxyethylmethacrylate, with polyfunctional (meth)acrylates of the abovementioned type are also suitable.

In addition to the (meth)acrylates, derivatives of (meth)acrylamides, e.g. N-methylol(meth)acrylamido ethers of polyols (e.g. glycol), are also suitable.

In addition to the elastomeric binder and copolymerizable ethylenically unsaturated monomeric compounds, the layer (A) crosslinkable by actinic radiation (=photosensitive recording layer (A)) contains one or more photoinitiators, e.g. benzoin or benzoin derivatives, such as benzoin ethers of straight-chain or branched monoalcohols of 1 to 6 carbon atoms, e.g. benzoin methyl ether, benzoin ethyl ether, benzoin isopropyl ether, benzoin n-butyl ether or benzoin isobutyl ether, symmetrically or asymmetrically substituted benzil acetals, such as benzil dimethyl acetal, benzil 1-methyl 1-ethyl acetal, diarylphosphine oxides, e.g. 2,4,6-trimethylbenzoyldiphenylphosphine oxide or 2,6-dimethoxybenzoyldiphenylphosphine oxide, or acyldiarylphosphine oxides according to German Laid Open Application DOS 29 09 992, or hydroxypropanones, such as 1-phenyl-2-methyl-2-hydroxy-1-propanone, and 1-hydroxycyclohexyl phenyl ketone. They may be used alone or as a mixture with one another or in combination with coinitiators, e.g. benzoin methyl ether with triphenyl phosphine, diacylphosphine oxides with tertiary amines or acyldiarylphosphine oxides with benzil dimethyl acetal.

In the mixtures, the photoinitiators or photoinitiator systems are used in an amount of from 0.001 to 10, advantageously from 0.1 to 5, in particular from 0.3 to 2%, by weight, based on the total amount of the photosensitive recording layer (A), the presence of photopolymerizable monomers playing a role in determining the amount.

Further assistants which may be added, in general in an amount of from 0.001 to 2% by weight, based on the total amount of the photosensitive recording layer (A), are thermal polymerization inhibitors which have no significant self-absorption in the actinic range in which the photoinitiator absorbs, e.g. 2,6-di-tert-butyl-p-cresol, hydroquinone, p-methoxyphenol, β-naphthol, phenothiazine, pyridine, nitrobenzene, m-dinitrobenzene or chloranil; thiazine dyes, such as thionine blue G (C.I. 52025), methylene blue B (C.I. 52015) or toluidine blue G (C.I. 52040).

Suitable dyes, pigments or photochromic additives can also be added to the photosensitive mixture of the recording layer (A) in an amount of from 0.0001 bis 2% by weight, based on the total amount of the photosensitive recording layer (A). They serve for identification or esthetic purposes. A precondition for the choice and amount of such additives is that they interfere with the photopolymerization of the mixtures to the same small extent as do the thermal polymerization inhibitors. For example, the soluble phenazinium, phenoxazinium, acridinium and phenothiazinium dyes, such as neutral red (C.I. 50040), safranine T (C.I. 50240), rhodanil blue, the salt or the amide of rhodamine D (basic violet 10, C.I. 45170), methylene blue B (C.I. 52015), thionine blue G (C.I. 52025) or acridine orange (C.I. 46005), are suitable. These dyes may also be used together with a sufficient amount of reducing agent which does not reduce the dye in the absence of actinic light but is capable of reducing the dye in the excited electronic state on exposure. Examples of such mild reducing agents are ascorbic acid, anethole, thiourea, e.g. diethylallylthiourea, in particular N-allylthiourea, and hydroxylamine derivatives, in particular salts of N-nitrosocyclohexylhydroxylamine, preferably the potassium, calcium and aluminum salts. The latter can simultaneously serve as thermal polymerization inhibitors. The reducing agents can be added in general in amounts of from 0.005 to 5% by weight, based on the mixture, the addition of from 3 to 10 times the amount of concomitantly used dye having proven useful in many cases. In addition, the formulations may also contain from 1 to 20, preferably from 3 to 10% by weight of bases which partially or completely neutralize the acid functions of the ethylenic/acrylic acid copolymers. Examples of suitable bases are alkali metal hydroxides, alkali metal alcoholates and amines and alkanolamines. Particularly suitable bases are monoethanolamine, diethanolamine, butylethanolamine and triethanolamine.

The production of the photopolymerizable relief-forming recording layer (A) to be used according to the invention from its components is carried out in general by mixing the components with the aid of known mixing methods and by processing the mixture to give the recording layer (A) with the aid of a known technique, such as casting solution, from calendering or extrusion, it also being possible to combine these measures with one another in a suitable manner.

The layer (A) crosslinkable by actinic radiation generally has a thickness of from 200 to 8000 μm, in particular from 500 to 6000 μm. The layer (B) sensitive to actinic radiation and, if required, a peelable cover sheet are applied to this layer (A) crosslinkable by actinic radiation. The layer (B) is soluble or dispersible in developers, according to the invention has an optical density of >2.5 in the actinic range, undergoes a change in the optical density of >1 as a result of one or more laser pulses in the wavelength range from 254 to 532 nm with an energy of from >5 to 50 J/cm$^2$ and essentially comprises arylazophosphonate-containing compounds.

Suitable arylazophosphonate-containing compounds to be used according to the invention for the layer (B) sensitive to actinic radiation are both those which contain arylazophosphonate groups in a polymer main chain (I) and those which contain the arylazophosphonate groups as a side chain on a polymer main chain (II).

Examples of suitable compounds (I) are those having groups of the formula

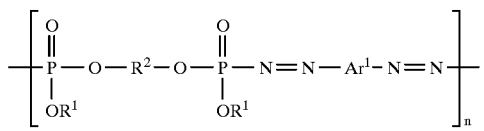

where $R^1$ is alkyl of 1 to 12, preferably 3 to 6 carbon atoms $R^2 = -(CH_2)_n-$, $-(CH_2)_n-O-(CH_2)_m-$,

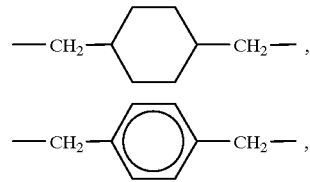

$-(CH_2)_2-O-X-O-(CH_2)_2-$, n are each 1, 2, 3 to 10 m are each 1, 2, 3 to 10

$Ar^1$ is

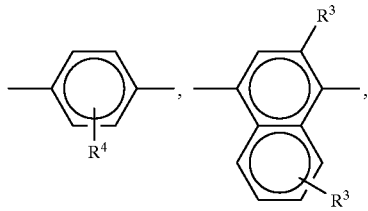

-continued

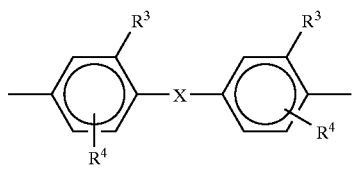

$R^3$ and $R^4$ are —OCH$_3$, OH, —SO$_3$H, —O—CH$_2$—CO$_2$H

X=

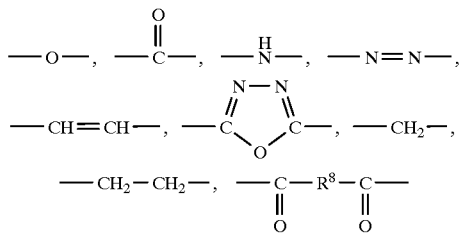

$R^8$ is alkanediyl of 1 to 12, preferably 3 to 6 carbon atoms, or arylene of 6 to 10, preferably 6, carbon atoms.

Examples of suitable compounds (II) are those which contain the following groups bonded to polymer main chains:

a)

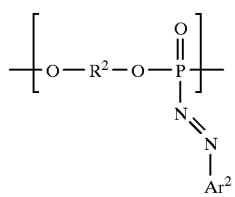

where Ar$^2$ is

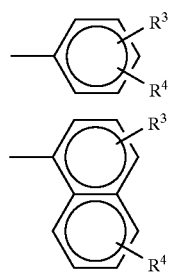

b)

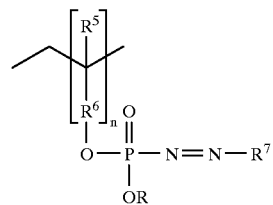

where R$^5$ is H or CH$_3$

R$^6$=

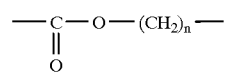

R$^7$ is alkyl of 1 to 12 carbon atoms

Compounds of the type (I) can be very easily prepared from bisphosphites with aromatic bisdiazonium salts by coupling. The synthesis of suitable bisphosphites is described by A. I. Zavalishina, et al., Zhurnal Obshchei Khimii, 38, 2271–76 (1968). The preparation of suitable aromatic bisdiazonium salts is carried out by standard methods. The coupling reaction of these two reactants is carried out by simply combining the corresponding solutions.

Compounds of the type (IIa) can be prepared by reacting polyphosphites, which are obtainable by transesterification of dialkylphosphites with the corresponding diols, with aromatic diazonium salts. The synthesis of the polyphosphites is described by S. Penczek and J. Pretula, Macromolecules 26, (1993), 2228; J. Pretula and S. Penczek, Macromol. Chem. Phys. 191, (1990), 671. Another method for the preparation of polyphosphites is based on the ring-opening polymerization of cyclic phosphites, such as

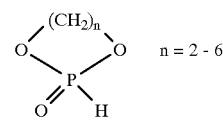

A peelable film transparent to actinic light, a cover sheet which is from 5 to 300 μm thick and consists of, for example, polyethylene or polyethylene terephthalate, may also be applied to the layer (B).

The processing steps which comprise the exposure to actinic light, development and drying are described in detail, for example, in the nyloflex® operating instructions (IIR 340705/1185) of BASF Aktiengesellschaft.

The layer (B), which is likewise sensitive to actinic radiation, can be recorded on imagewise by means of a UV laser, preferably a pulsed XeCl-excimer laser (wavelength: 308 nm). Appropriate lasers are offered, for example, by Lambda Physics. The imagewise recording can advantageously be carried out on a drum on which the plate is mounted. Here, the layer (B) is ablated in the parts exposed to the actinic radiation. In this way, a mask consisting of opaque and transparent image sections is produced for the subsequent uniform exposure process. The layer (B) can be ablated only with high energy of from >5 to 50 J/cm$^2$; otherwise, it would be ablated during the uniform exposure to actinic light. The digital information transfer is followed by uniform exposure to actinic light. This can be effected either on the drum of the UV laser or the plate is removed and the uniform exposure is carried out in a conventional flat-plate exposure unit (e.g. FIII exposure unit from BASF). The recording element is then developed. This can be carried out using commercial continuous or circular washers, for example from BASF. Depending on the chemistry of the layer (B), the latter may have to be removed in a preliminary developer if this layer is not soluble or dispersible in the developer of the layer (A). The preliminary development step can be carried out very simply, for example in commercial pad washers from BASF, which are very suitable for this purpose.

Suitable developers for layer (A) are mixtures of perchloroethylene with alcohols, mixtures of hydrocarbons with alcohols, mixtures of alcohol with water, pure water or mixtures of water and components soluble therein, such as sodium carbonate, sodium hydroxide, citric acid, lactic acid, surfactants, etc.

After the development, the recording material is also subjected to a drying step. Here, the developer still present in the relief layer is removed. Here too, all commercial dryers, including, for example, those from BASF AG, are suitable.

The examples illustrate the production of the novel photosensitive recording elements and the printed copies obtained with these recording elements.

In the examples which follow, parts and percentages are by weight, unless stated otherwise.

COMPARATIVE EXAMPLE 1

A photosensitive recording layer was produced similarly to Example 2 of U.S. Pat. No. 5,262,275. This photosensitive recording material was mounted on a vacuum drum and exposed to an Nd:YAG laser (wavelength 1064 nm). The spot diameter of the IR laser beam was adjusted to 10 μm. The exposure unit used here was from Basel-Scheel. Thereafter, the plate was removed from the drum and exposed uniformly in an FIII exposure unit (from BASF) for 15 minutes. Thereafter, the plate was developed in a BASF circular washer with a 3:1 mixture of perchloroethylene/butanol and then dried for 2 hours at 60° C. The chosen print subject had a screen ruling of 54 L/cm and a tonal value range of 3–95°. This flexographic printing plate was then mounted on a commercial flexographic printing press and polyethylene film was printed with alcohol inks. The printed copy was then assessed visually in comparison with Example 1.

EXAMPLE 1

A solution consisting of 10 parts of arylazophosphonate I of the formula (I)
(where $R^1=CH_3$; $R^2=$

)

and 90 parts of methylene chloride was cast on a polyethylene terephthalate film (125 μm Mylar from DuPont) in such a way that the optical density of this layer was >3.

This composite was laminated with a Cyrel® 107 PLS+ printing plate (from DuPont) after the protective film and the release layer underneath had been removed from the plate by peeling them off.

After the protective film had been peeled off, this photosensitive recording material was mounted on a vacuum drum and exposed to an XeCl laser (wavelength 308 nm). The spot diameter of the UV laser beam was adjusted to 5 μm. The laser was from Lambda-Physics. The plate was then removed from the drum and exposed uniformly in an FIII exposure unit (from BASF) for 15 minutes. Thereafter, the plate was developed in a BASF circular washer with a 3:1 mixture of perchloroethylene/butanol and then dried for 2 hours at 60° C. The chosen print subject corresponded to that of Comparative Example 1. Thereafter, this flexographic printing plate was mounted on a commercial flexographic printing press and PE film was printed with alcohol inks. The printed copy was then assessed visually. Direct comparison with Comparative Example 1 clearly showed in an impressive manner that the screen lines in Example 1 are at least as good as in Comparative Example 1.

We claim:

1. A multilayer recording element which is suitable for producing flexographic printing plates by digital information transfer and has, arranged one on top of the other on a dimensionally stable substrate, a layer (A) which is crosslinkable by actinic radiation and, if required, is bonded to the dimensionally stable substrate by an adhesion-promoting layer, a layer (B) which is likewise sensitive to actinic radiation and, if required, a peelable cover sheet, wherein the layer (A) crosslinkable by actinic radiation is crosslinked by imagewise exposure to actinic radiation of from 0.5 to 5 J/cm² and can then be washed out by a developer and comprises a mixture of at least one elastomeric binder, ethylenically unsaturated copolymerizable organic compounds, a photoinitiator or photoinitiator system and, if required, further assistants, and the layer (B), which is also sensitive to actinic radiation, is a layer which is soluble or dispersible in developers and has an optical density >2.5 in the actinic range, undergoes a change in the optical density by >1 as a result of one or more laser pulses in the wavelength range from 254 to 532 nm with an energy of from >5 to 50 J/cm² and comprises arylazophosphonate-containing polymers.

2. A recording element as claimed in claim 1, wherein water or an alcohol/water mixture is suitable as the developer both for the layer (A) and for the layer (B).

3. A recording element as claimed in claim 1, wherein an organic solvent or solvent mixture is suitable as the developer both for layer (A) and for layer (B).

4. A recording element as claimed in claim 1, wherein an organic solvent or solvent mixture is suitable as the developer for layer (A) and water or an alcohol/water mixture is suitable as the developer for layer (B).

5. A process for producing flexographic printing plates, wherein the layer (B) of the multilayer recording element as claimed in claim 1, which layer is sensitive to actinic radiation, is structured imagewise from a digital data set by means of a UV laser, the layer (A) is then crosslinked by uniform exposure to actinic radiation in the subsequently printing parts and the layer (B) is then dispersed or dissolved in a developer and the noncrosslinked image sections of the layer (A) are developed in the same or a different developer.

* * * * *

UNITED STATES PATENT AND TRADEMARK OFFICE
CERTIFICATE OF CORRECTION

PATENT NO.: 5,925,490

DATED: July 20, 1999

INVENTOR(S): LOERZER et al.

It is certified that error appears in the above-identified patent and that said Letters Patent is hereby corrected as shown below:

On the title page, item:

--[30]  Foreign Application Priority Data

Mar. 22, 1996   [DE]   Germany   196 11 262.1--.

Signed and Sealed this

Thirtieth Day of November, 1999

Attest:

Q. TODD DICKINSON

Attesting Officer

Acting Commissioner of Patents and Trademarks